United States Patent [19]
Garskamp

[11] 3,934,191
[45] Jan. 20, 1976

[54] CIRCUIT ARRANGEMENT FOR GENERATING A STABILIZED DIRECT VOLTAGE WITH SUPERPOSITION OF A CONTROL VOLTAGE

[75] Inventor: Arnoldus Garskamp, Eindhoven, Netherlands

[73] Assignee: U.S. Philips Corporation, New York, N.Y.

[22] Filed: Nov. 15, 1973

[21] Appl. No.: 416,035

[30] Foreign Application Priority Data
Dec. 2, 1972 Netherlands................ 7216406

[52] U.S. Cl................ 323/22 T; 323/1; 325/422; 330/40
[51] Int. Cl.²............................. H03J 3/18
[58] Field of Search............. 325/419–422; 307/296, 297; 323/1, 4, 16, 19, 22 T; 330/22, 40, 69

[56] References Cited
UNITED STATES PATENTS

| | | |
|---|---|---|
| 3,371,269 | 2/1968 | Wattson ............................ 323/22 T |
| 3,610,955 | 10/1971 | Blaser et al. ...................... 330/69 X |
| 3,689,848 | 9/1972 | Geffe et al. ....................... 330/69 X |
| 3,735,151 | 5/1973 | Frederiksen et al. ............. 330/40 X |
| 3,781,699 | 12/1973 | Sakamoto ......................... 330/22 X |

*Primary Examiner*—A. D. Pellinen
*Attorney, Agent, or Firm*—Frank R. Trifari; Henry I. Steckler

[57] ABSTRACT

Integrated circuit for superposition of an AFC control voltage on a stabilized direct voltage for varactor diode tuning in radio or television receivers. It features a voltage divider having a controlled current applied to it. A circuit disables it when tuning.

11 Claims, 1 Drawing Figure

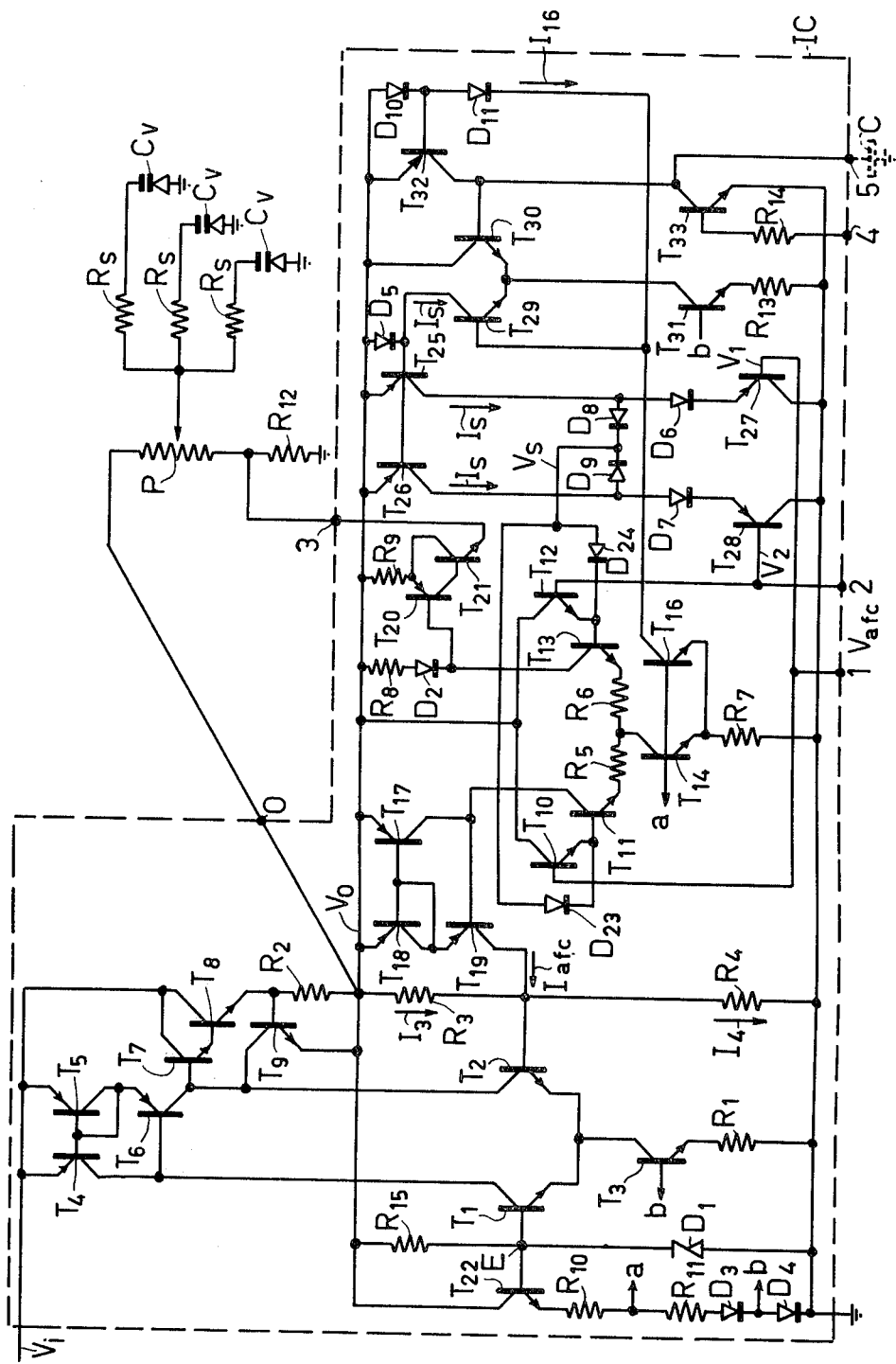

CIRCUIT ARRANGEMENT FOR GENERATING A STABILIZED DIRECT VOLTAGE WITH SUPERPOSITION OF A CONTROL VOLTAGE

The invention relates to a circuit arrangement for generating a stabilized direct voltage with superposition of a control voltage for combined tuning and automatic frequency control of a receiver using a variable—capacitance diode, commonly referred to as varactor diode or even tuner diode.

The tuning sections of, for example, present-day radio and television receivers usually include varactor diodes. The tuning voltage applied to these diodes generally is obtained by means of a manually operated tuning potentiometer or a preselection potentiometer. These potentiometers are fed with a direct voltage which is highly stabilized against supply voltage fluctuations and/or temperature variations (for example 30 volts ± 50 millivolts). This stabilized direct voltage is to be derived from a reference voltage source which generally produces a considerably lower voltage (for example 6.4 volts).

Frequently in such receivers automatic frequency control (AFC) also is used. If no separate AFC varactor diode but the tuning varactor diode provided in any case is to be used, the AFC voltage generated is to be superposed on the tuning voltage, preferably on the said stabilized direct voltage. Care should be taken to ensure that in this process no unstabilized or insufficiently stabilized voltage portion also is superposed.

It is an object of the present invention to provide a circuit arrangement which enables the said purposes to be simply achieved in largely monolithically integrated form, and the circuit arrangement according to the invention is characterized by the provision of a differential amplifier comprising a first and a second emitter-coupled transistor stage, a reference voltage source which is connected to the control electrode of the first transistor stage, a collector load for the second transistor stage, a resistive voltage divider having a tapping which is connected to the control electrode of the second transistor stage, and a buffer amplifier connected between the said collector load and the resistive voltage divider, a control current which produces the control voltage being supplied to a tapping, in particular to the said tapping, on the resistive voltage divider in order to superpose the control voltage on the direct voltage across the resistive voltage divider. The collector load for the second transistor stage preferably comprises a current mirror controlled from the collector of the first transistor stage.

The control voltage to be superposed frequently is available as a difference voltage between two terminals which themselves have a given non-defined voltage with respect to earth. According to a further aspect of the invention, however, the control current required for the superposition may simply be derived from the available control voltage by means of a control voltage differential amplifier which comprises a third and a fourth emitter-coupled transistor stage, to the coupled emitters of which stages is connected a stabilized direct-current source, the third transistor stage supplying the said control current for the resistive voltage divider.

When the stabilized direct voltage with the control voltage superposed on it is applied to the upper end of a tuning potentiometer and/or a preselection potentiometer and the tuning voltage for the varactor diodes is taken from the slider of the potentiometer, the extent of the lowering of the slider causes not only a progressively decreasing part of the direct voltage but also a progressively decreasing part of the control voltage to be applied to the varactor diode. This is advantageous, because the sensitivity (dC/dV) of varactor diodes wherein C is the capacitance and V the voltage, increases with decreasing direct voltage, so that the said step causes the control sensitivity to remain substantially constant. However, when the potentiometer is turned down to a large extent (corresponding to a direct voltage of less than 4 volts), which may be required in some cases (for example in television receivers) to enable the entire tuning range to be covered, the control sensitivity proves to be greatly decreased. In the circuit arrangement according to the invention this difficulty may readily be obviated by supplying an additional control current, for example a current supplied by the fourth transistor stage, to the lower end of the potentiometer.

In general it is desirable to have the possibility of switching off the automatic frequency control during tuning, because with the AFC switched on a strong transmitter signal considerably impedes or even prevents tuning to an adjacent weaker transmitter signal. Care should be taken to ensure that with the AFC switched off the circuit arrangement supplies a voltage which accurately corresponds to the voltage which it supplies with the AFC switched on when the receiver is exactly tuned to a transmitter signal. In a circuit arrangement according to the invention the said requirements may simply be fulfilled, and for this purpose the circuit arrangement according to the invention may be characterized in that the control-voltage differential amplifier also acts as a control-voltage switch-off circuit for preventing the control voltage from being superposed on the stabilized direct voltage in that the said third and fourth transistor stages are in the form of Darlington stages each comprising a pre-transistor and a main transistor, a switch-off voltage being applied to each of the connections between the pre-transistor and the main transistor via an isolating pn junction.

To prevent an inadmissibly high reverse voltage from being applied to the said pre-stages when the AFC is switched off, provision may further be made of means for varying the amplitude of the said switching voltage in accordance with the voltage level of either or both inputs of the control-voltage differential amplifier.

To enable the circuit including AFC which may be switched off to be used both in receivers provided with continuous tuning, in which it must be possible to switch off the control during the entire tuning operation, and in receivers having discontinuous tuning (tuning in steps) in which the control is to be switched off for a given period only, the circuit arrangement according to the invention may include a switch-off control terminal for continuously generating a switching voltage which prevents the control voltage from being superposed on the stabilized direct voltage in the case of continuous control of the said switch-off control terminal, and a further terminal for connection at will to a capacitor for generating the switching voltage during a given period the duration of which depends upon the value of the capacitor, in the case of pulsed control of the said switch-off control terminal.

An embodiment of the invention will now be described, by way of example, with reference to the accompanying diagrammatic drawing, the single FIGURE of which is a circuit diagram of a circuit arrangement according to the invention.

The circuit arrangement shown in the FIGURE includes a differential amplifier having transistors $T_1$ and $T_2$ the emitters of which are connected to a direct-current source constituted by a transistor $T_3$ provided with an emitter resistor $R_1$ and having its base connected to a diode $D_4$ (point $b$). A collector load, which is in the form of a known current mirror comprising three transistors $T_4$, $T_5$ and $T_6$ and is controlled by the collector current of $T_1$, is connected between the collector of $T_2$ and a non-stabilized supply voltage $V_i$. The collector of $T_2$ is also connected to the input of a Darlington buffer amplifier $T_7$, $T_8$ the output electrode of which (the emitter of $T_8$) is connected to an output terminal O of the circuit via a small resistor $R_2$. A resistive voltage divider $R_3$, $R_4$ the tapping on which is connected to the base of the transistor $T_2$ is connected between the output terminal O and earth. The base of the transistor $T_1$ is connected to a reference voltage source, for example a Zener diode $D_1$, which provides a voltage E (6.4 volts) and is fed from the output terminal O via a resistor $R_{15}$.

The circuit arrangement described so far operates as follows: The current from the direct-current source $T_3$, $R_1$ is divided between $T_1$ and $T_2$ and then flows through the current mirror $T_4$, $T_5$, $T_6$, the current through $T_1$ being the control current and that through $T_2$ being the output current of the current mirror. Because the output current of the current mirror is equal to its control current, the two emitter-collector currents of $T_1$ and $T_2$ are equal also. This means that the base voltage of $T_2$ is accurately adjusted to the same value as the base voltage (E) of $T_1$. Even a small imbalance (of a few millivolts) between the base voltages of $T_1$ and $T_2$ gives rise to a correction current to the base of $T_7$ which, greatly amplified by the Darlington amplifier $T_7$, $T_8$, so modifies the current passing through the voltage divider $R_2$, $R_3$, $R_4$ as to restore the balanced condition.

Assuming the current $I_3$ flowing through $R_3$ to be equal to the current $I_4$ flowing through $R_4$, the voltage $V_O$ at the output terminal O will be $$V_O = E \ \frac{R_3 + R_4}{R_4}$$

Thus the output voltage $V_O$ is dependent only upon the reference voltage $E$ and the resistors $R_3$ and $R_4$. Consequently a very stable output voltage is obtained the value of which is greater than that of the reference voltage and may be accurately adjusted by means of the resistors $R_3$ and $R_4$.

As described hereinbefore it is desirable for an AFC-dependent voltage to be superposed on the output voltage $V_O$. For this purpose an AFC-dependent current $I_{AFC}$, which is produced in a manner to be described hereinafter, is supplied to the junction point of $R_3$ and $R_4$. Now we no longer have $I_3 = I_4$, but $I_3 = I_4 - I_{AFC}$. Owing to the abovedescribed interplay of the differential amplifier $T_1$, $T_2$ and the current mirror $T_4$, $T_5$, $T_6$, however, the differential amplifier remains balanced, so that the voltage at the junction point of $R_3$ and $R_4$ remains equal to E ($= I_4 \cdot R_4$). The output voltage $V_O = I_3 R_3 + I_4 R_4$ then will be $$V_O = E \ \frac{R_3 + R_4}{R_4} - I_{AFC} R_3$$

which means that this voltage is constituted by the superposition of a stabilized direct-voltage component $$E \ \frac{R_3 + R_4}{R_4}$$

and an AFC-voltage component $I_{AFC} R_3$.

The circuit arrangement includes a further transistor $T_9$ having its base connected to the upper end of $R_2$, its emitter to the output terminal O and its collector to the collector of $T_2$. $T_9$ and $R_2$ together act as a shortcircuit protection. The resistor $R_2$ is so small (20Ω) that in the normal operating condition the voltage across $R_2$ is not sufficient to cause the transistor to conduct. In the case of overloading or a short-circuit of the output O to earth the transistor $T_9$ becomes conductive and takes over such a part of the collector current of $T_6$ that the control current to $T_7$ and hence the supply current to $T_8$ are sufficiently limited.

The control current $I_{AFC}$ is produced by means of a differential amplifier comprising two Darlington transistor stages $T_{10}$, $T_{11}$ and $T_{12}$, $T_{13}$. The emitters of $T_{10}$ and $T_{12}$ are connected to the bases of $T_{11}$ and $T_{13}$ respectively. The emitters of $T_{11}$ and $T_{13}$ each are connected through a resistor $R_5$ and $R_6$ respectively to a direct-current source comprising a transistor $T_{14}$ having an emitter resistor $R_7$. The bases of $T_{10}$ and $T_{12}$ are connected to input terminals 1 and 2 respectively between which an AFC voltage $V_{AFC}$ (of at most about 6 volts) can be set up. The collector current of $T_{11}$ is mirrored in a current mirror $T_{17}$ and $T_{18}$, $T_{19}$ and then supplied as the control current $I_{AFC}$ to the junction point of $R_3$ and $R_4$. The collector current of $T_{13}$ is mirrored and amplified in an amplifier comprising resistors $R_8$, $R_9$, a diode $D_2$ and transistors $T_{20}$, $T_{21}$ and then supplied to an output terminal 3.

In addition to converting a control voltage ($V_{AFC}$) into a control current ($I_{AFC}$) the differential amplifier $T_{10}$ to $T_{13}$ is mainly required to suppress the influence of the input voltages at the terminals 1 and 2 with respect to earth (common mode suppression), and to amplify only the voltage difference between these terminals. Consequently the control voltage $V_{AFC}$ can be applied to the terminals 1 and 2 at widely different voltage levels (for example from 5 to 15 volts) with respect to earth. As a result the circuit arrangement is capable of universal application.

The control current $I_{AFC}$ depends not only upon the difference voltage $V_{AFC}$ between the terminals 1 and 2 but also upon the direct current flowing through the transistor $T_{14}$. Hence this direct current must be highly stabilized. For this purpose the circuit arrangement includes a transistor $T_{22}$ having its base connected to the reference voltage source $D_1$ and its emitter to the series combination of two resistors $R_{10}$, $R_{11}$ and two diodes $D_3$, $D_4$. The connection ($a$) between $R_{10}$ and $R_{11}$ is connected to the bases of $T_{14}$ and $T_{16}$. Assuming that the highly temperature-dependent diode voltages of $D_3$ and $D_4$ and the base emitter voltages of $T_{22}$, $T_{14}$ and $T_{16}$ all are equal to one another, it may readily be shown that the currents produced by $T_{14}$ and $T_{16}$ are temperature-independent if $R_{10} = 2R_{11}$, for example $R_{10} = 4$k Ω and $r_{11} = 2$ k Ω.

The output voltage $V_O$ is applied to the upper end or ends of at least one tuning potentiometer P, the slider of the or each potentiometer being connected via at least one isolating resistor $R_s$ to at least one varactor diode $C_v$. The or each varactor diode is connected in a tuning circuit of a receiver in a manner not shown. An adjustable part of the direct-voltage component of $V_O$ and an adjustable part of the AFC component of $V_O$ are applied to the or each varactor diode via the respective potentiometer P. As has been set forth at the beginning of this specification, it is desirable for an additional AFC signal to be applied to the lower end of the tuning potentiometer P. For this purpose the lower end of this potentiometer is connected to earth via a resistor $R_{12}$, the AFC output current from $T_{21}$ (output terminal 3) being supplied to the junction point of P and $R_{12}$.

In general, in AFC circuits it is desirable to have the possibility of switching off disabling the AFC in particular during tuning from one transmitter signal to another transmitter signal, because the AFC interferes with the tuning operation. The term "AFC switch-off" is to be understood to mean not only that no longer any AFC information reaches the tuning means (varactor diodes), but also that the adjustment of these tuning means is made equal to the adjustment which they would have if, with the AFC switched on, the receiver should be exactly tuned to a transmitter signal. In other words, with the AFC switched-off the AFC currents supplied by $T_{19}$ and $T_{21}$ must not be zero but have the values which they normally have when the voltage at the terminal 1 is equal to the voltage at the terminal 2 ($V_{AFC} = 0$).

For this purpose the fact is used that the control voltage differential amplifier comprises two Darlington pairs. A diode $D_{23}$ is connected to the junction point of $T_{10}$ and $T_{11}$ and a diode $D_{24}$ is connected to the junction point of $T_{12}$ and $T_{13}$. During the periods in which the AFC is to be switched off a switching voltage $V_s$ is applied to the interconnected anodes of $D_{23}$ and $D_{24}$. This voltage must exceed the highest possible voltage which may appear at the input terminals 1 and 2. This ensures that the diodes $D_{23}$ and $D_{24}$ are rendered conductive and the transistors $T_{10}$ and $T_{12}$ are cut off by the switching voltage $V_s$. This results in that:

1. owing to the transistors $T_{10}$ and $T_{12}$ being cut off the control voltage $V_{AFC}$ no longer influences the circuit and moreover the switching voltage $V_s$ does not adversely affect the circuit which generates the AFC voltage;
2. any differences between the base emitter voltages of $T_{11}$ and $T_{13}$ and any differences between $R_5$ and $R_6$ which give rise to an intrinsic imbalance of the differential amplifier are automatically taken into account, at switch-off, because these elements remain operative in the circuit arrangement. Hence, with the AFC switched off the circuit arrangement produces substantially the same current at the junction point of the $R_3$ and $R_4$ and at the terminal 3 as when the AFC is switched on with $V_{AFC} = 0$, so that correct AFC switch-off is obtained.

As has been stated hereinbefore, the circuit arrangement is designed so that the AFC voltage $V_{AFC}$ can be applied to the terminals 1 and 2 at various voltage levels (for example between 5 and 15 volts) with respect to earth. However, the switch-off voltage $V_s$ must exceed the highest voltage which may appear at the terminals 1 and 2, i.e. $V_s$ must exceed 15 volts. But this would mean that, when the AFC voltage is applied at a level of 5 volts with respect to earth, the reverse voltage across the base emitter junction of each of the transistors $T_{10}$ and $T_{12}$ would be about 10 volts. This would give rise to Zener breakdown of $T_{10}$ and $T_{12}$, which may give rise to an undesirable difference voltage containing much Zener diode noise between the bases of $T_{11}$ and $T_{13}$. To avoid this the circuit arrangement includes an arrangement which converts a switch-off current $I_s$ into a switch-off voltage $V_s$ which follows the level of the voltage at the terminals 1 and 2. For this purpose the switchoff current $I_s$ is supplied to a diode $D_5$ which together with a transistor $T_{25}$ forms a first current mirror and also together with a transistor $T_{26}$ forms a second current mirror. Thus the transistors $T_{25}$ and $T_{26}$ each supply a current $I_s$. The output current of $T_{25}$ is supplied via a diode $D_6$ to the emitter of a transistor $T_{27}$ the base of which is connected to the input terminal 1, and similarly the output current of $T_{26}$ is supplied via a diode $D_7$ to the emitter of a transistor $T_{28}$ the base of which is connected to the input terminal 2. Furthermore, two series-connected diodes $D_8$ and $D_9$ are connected with opposite pass directions between the collectors of $T_{25}$ and $T_{26}$, the switch-off voltage $V_s$ being produced at the junction point of these diodes.

When a switch-off current $I_s$ flows the diodes $D_6$ and $D_7$ and the transistors $T_{27}$ and $T_{28}$ are conductive. Denoting the voltages at the input terminals 1 and 2 by $V_1$ and $V_2$ respectively, and denoting the voltage across a conductive pn junction (diode or base-emitter junction) which is about 0.6 to 0.7 volt by $V_{pn}$, the voltage at the emitter of $T_{27}$ is: $V_1 + V_{pn}$, the voltage at the emitter of $T_{28}$ is: $V_2 + V_{pn}$, the voltage at the anode of $D_6$ is: $V_1 + 2V_{pn}$ and the voltage at the anode of $D_7$ is: $V_2 + 2V_{pn}$. Of the two diodes $D_8$ and $D_9$ the one having the higher anode voltage will conduct. Thus, when $V_1 > V_2$, $D_8$ will conduct and $V_s = V_1 + V_{pn}$. When, however, $V_1 < V_2$, $D_9$ will conduct and $V_s = V_2 + V_{pn}$. Consequently via the conducting diodes $D_{23}$ and $D_{24}$ the emitter voltages of $T_{10}$ and $T_{12}$ will be equal to $V_1$ when $V_1 > V_2$ and equal to $V_2$ when $V_2 > V_1$. Thus the emitter voltages of $T_{10}$ and $T_{12}$ always are equal to the higher of the two terminal voltages $V_1$ and $V_2$. This ensures that $T_{10}$ and $T_{12}$ are cut off (AFC switched-off), but the cut-off voltage cannot exceed the difference between $V_1$ and $V_2$, i.e. the AFC-voltage $V_{AFC}$.

When the switch-off current $I_s$ flowing through $D_5$ is removed, the diodes $D_5$ to $D_9$ and $D_{23}$, $D_{24}$ and the transistors $T_{25}$ to $T_{28}$ become non-conductive. In this case $T_{10}$ and $T_{12}$ are conducting and the AFC is normally operative.

The circuit arrangement includes two emitter-coupled transistors $T_{29}$ and $T_{30}$ for producing the switch-off current $I_s$. The coupled emitters are connected to the collector of a transistor $T_{31}$ provided with an emitter resistor $R_{13}$ and having its base connected to the diode $D_4$, which transistor acts as a direct-current source. Depending upon whether the base voltage of $T_{30}$ is higher or lower than the base voltage of $T_{29}$ the collector direct current of $T_{31}$ either flows via $T_{30}$ to the terminal O, which acts as the source of the supply voltage $V_O$, or it flows via $T_{29}$ and $D_5$ as the switch-off current $I_s$. The fixed base voltage for $T_{29}$ is obtained by means of two series-connected diodes $D_{10}$ and $D_{11}$ which pass the constant collector current $T_{16}$ from $T_{16}$. Thus the voltage at the base of $T_{29}$ is $V_O - 2V_{pn}$, where $V_{pn}$ is the pass voltage (of 0.7 volts) of $D_{10}$ and $D_{11}$. The diode $D_{10}$ is connected between the emitter and the base of a transistor $T_{32}$ the collector of which is connected to the base of $T_{30}$. This collector is also connected to the collector of a control transistor $T_{33}$ the base of which is connected via an isolating resistor $R_{14}$ to a switch-off (AFC-disabling) control terminal 4. This terminal serves for controlling the AFC circuit.

If the terminal 4 is open or connected to a voltage which cuts off the transistor $T_{33}$, the collector current of $T_{32}$ cannot flow to earth. As a result, the transistor $T_{32}$ bottoms, so that the collector voltage of $T_{32}$ and hence the base voltage of $T_{30}$ is smaller than the voltage $V_0$ by the knee voltage (of 0.1 volt) of $T_{32}$ only. Consequently the base voltage of $T_{30}$ ($V_0 - 0.1$ volt) is higher by about 1.3 volts than the base voltage of $T_{29}$ ($V_0 - 1.4$ volts). Hence the collector current of $T_{31}$ flows through $T_{30}$; no current flows through $D_5$, and the AFC is switched on in the aforedescribed manner.

If a sufficiently high positive voltage is applied to the terminal 4, $T_{33}$ bottoms and the collector current of $T_{32}$ can flow to earth via $T_{33}$. As a result, the base voltage of $T_{30}$ is low, and the current of $T_{31}$ flows via $T_{29}$ and $D_5$ and thus switches off the AFC.

The aforedescribed AFC switch-off may be used in the case of a receiver provided with continuous tuning. As long as the receiver is being tuned, for example by shifting the slider on the tuning potentiometer P, a positive voltage is applied to the control terminal 4 in a non-specified manner and the AFC is switched off. In the case of a receiver using discontinuous tuning, i.e. a receiver which is stepped from one tuned position to another, it is desirable for the AFC to be switched off during a given time (of for example 1 s). For this purpose a capacitor C is connected to a terminal 5 connected to the collector of $T_{33}$, a short-duration positive switching pulse (of for example a few ms) being applied to the control terminal 4. Under the influence of this switching pulse the capacitor C rapidly discharges via $T_{33}$. After the control transistor $T_{33}$ has been cut-off again, the capacitor C is gradually charged by the collector current of $T_{32}$, and the AFC is switched on again only when the capacitor voltage has risen to about the value $V_0 - 2V_{pn}$ of the base of $T_{29}$. The charge time T of the capacitor is $$T = \frac{C(V_0 - 2V_{pn})}{I_{32}}.$$

Thus this time is a function of the collector current $I_{32}$ of $T_{32}$. By deriving this current from the stabilized current $I_{16}$ of $T_{16}$ a constant AFC switch-off time is obtained.

When during the time in which the capacitor C is charged the tuning is changed the capacitor discharges again via $T_{33}$. In the event of a rapid sequence of discontinuous tuning changes the AFC remains inoperative until the said period of is has elapsed after the last change.

Preferably the entire circuit arrangement shown within a frame of broken lines IC is manufactured in monolithic integrated-circuit form with the exception of the elements $D_1$, $R_3$, $R_4$ and $R_{15}$. Moreover the resistor $R_7$ is preferably mounted externally of the IC, because via $T_{14}$ it determines the values of the AFC currents supplied to the junction point of $R_3$ and $R_4$ and to the output terminal 3, and via $T_{16}$, $D_{10}$ and $T_{32}$ it determines the charge time constant of the capacitor C.

What is claimed is:

1. Circuit arrangement for generating a stabilized direct voltage upon which a control voltage is superposed for combined tuning and automatic frequency control of a receiver including a varactor diode, said circuit comprising a differential amplifier comprising first and second emitter-coupled transistor stages, a fixed reference voltage source coupled to the control electrode of the first transistor, a collector load for the second transistor, a passive resistive voltage divider having a first tapping coupled to the control electrode of the second transistor stage, a buffer amplifier coupled between the said collector load and the resistive voltage divider, and means for supplying a control current which produces the said control voltage to a second tapping on the resistive voltage divider for superposing the control voltage on the direct voltage across the resistive voltage divider.

2. Circuit arrangement as claimed in claim 1, wherein the collector load for the second transistor stage comprises a current mirror controlled from the collector of the first transistor stage.

3. Circuit arrangement as claimed in claim 1, further comprising a control voltage differential amplifier comprising third and fourth emitter-coupled transistor stages and a stabilized direct-current source coupled to the emitters of said third and fourth transistors, the said third transistor stage comprising said supplying means.

4. A circuit as claimed in claim 3 further comprising a tuning potentiometer having an upper end, a lower end, and a slider, means for applying the stabilized direct voltage with the superposed control voltage to the upper end, a varactor diode coupled to said slider, and means for providing an additional control current to the lower end.

5. Circuit arrangement as claimed in claim 4, wherein said providing means comprises the fourth transistor stage.

6. Circuit arrangement as claimed in claim 1, further comprising a tuning potentiometer having an upper end, a lower end, and a slider, means for applying the stabilized direct voltage with the superposed control voltage to the upper end, at least one varactor diode coupled to said slider, and means for applying an additional control current to the lower end of the tuning potentiometer.

7. Circuit arrangement as claimed in claim 1, further comprising a switch-off control terminal means for continuously generating a switching voltage which upon continuous control of the said switch-off terminal prevents the control voltage from being superposed on the stabilized direct voltage, a capacitor, and a further terminal means for selective connection to said capacitor for generating the switching voltage during a given period the duration of which depends upon the value of the capacitor in the case of pulsed control of the said switch-off control terminal.

8. A circuit as claimed in claim 1 wherein said second tapping comprises said first tapping.

9. A circuit arrangement for generating a stabilized direct voltage upon which a control voltage is superposed for combined tuning and automatic frequency control of a receiver including a varactor diode, said circuit comprising a differential amplifier comprising first and second emitter-coupled transistor stages, a reference voltage source coupled to the control electrode of the first transistor, a collector load for the second transistor, a resistive voltage divider having a first tapping coupled to the control electrode of the second transistor stage, a buffer amplifier coupled between the said collector load and the resistive voltage divider, means for supplying a control current which produces the said control voltage to a second tapping on the resistive voltage divider for superposing the control voltage on the direct voltage across the resistive voltage divider, a control voltage differential amplifier comprising third and fourth emitter-coupled transistor stages, a stabilized direct-current source coupled to the emitters of said third and fourth transistors, the said third transistor stage comprising said supplying means, the control voltage differential amplifier comprising a control voltage switch-off device means for preventing the control voltage from being superposed on the stabilized direct voltage, wherein said third and fourth transistor stages comprise Darlington stages each comprising a pre-transistor and a main transistor coupled thereto, and means for applying a switch-off voltage to each connection between pre-transistor and main transistor via an isolating pn junction.

10. A circuit as claimed in claim 9 wherein said second tapping comprises said first tapping.

11. Circuit arrangement as claimed in claim 9, further comprising means for varying the amplitude of the said switching voltage in accordance with the voltage level of at least one of the inputs of the control voltage differential amplifier.

* * * * *